(12) United States Patent
Lim et al.

(10) Patent No.: US 9,929,669 B2
(45) Date of Patent: Mar. 27, 2018

(54) INVERTER

(71) Applicant: LSIS CO., LTD., Gyeonggi-do (KR)

(72) Inventors: Deok-Young Lim, Gyeonggi-do (KR); Chun-Suk Yang, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/426,378

(22) Filed: Feb. 7, 2017

(65) Prior Publication Data

US 2017/0244335 A1    Aug. 24, 2017

(30) Foreign Application Priority Data

Feb. 24, 2016   (KR) ........................ 10-2016-0021748

(51) Int. Cl.
*H05K 7/20* (2006.01)
*H02M 7/00* (2006.01)
*H05K 7/14* (2006.01)
*H01L 23/473* (2006.01)

(52) U.S. Cl.
CPC .......... *H02M 7/003* (2013.01); *H05K 7/1417* (2013.01); *H05K 7/1432* (2013.01); *H05K 7/209* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 5,555,159 A    9/1996 Dore
5,835,350 A *  11/1998 Stevens ................... H02M 3/00
                                                  165/80.2
(Continued)

FOREIGN PATENT DOCUMENTS

JP   2009-165327 A   7/2009
JP      5319979 B2   10/2013
(Continued)

OTHER PUBLICATIONS

European Search Report dated Jul. 17, 2017 issued in corresponding European Application No. 17152806.0.
(Continued)

*Primary Examiner* — Anthony Haughton
*Assistant Examiner* — Razmeen Gafur
(74) *Attorney, Agent, or Firm* — K&L Gates LLP (57) ABSTRACT

Disclosed herein is an inverter. The inverter includes a base provided with a heat dissipation part, a main board disposed on the base to output an input power along an independent power flow through a rectification part and a inverter part, and a control board fixed to be electrically connected to the main board to form a flow of a secondary power and a flow of an electrical signal, the flow of the secondary power and the flow of the electrical signal being independent from each other.

4 Claims, 8 Drawing Sheets

(56) References Cited

U.S. PATENT DOCUMENTS

| | | | | |
|---|---|---|---|---|
| 6,201,701 | B1* | 3/2001 | Linden | H05K 1/0206 174/252 |
| 6,275,946 | B1* | 8/2001 | Meir | G06F 1/30 307/64 |
| 6,362,964 | B1* | 3/2002 | Dubhashi | H01L 23/24 257/724 |
| 6,434,003 | B1* | 8/2002 | Roy | H05K 7/20927 165/104.22 |
| 6,657,320 | B1* | 12/2003 | Andrews | H02J 9/066 307/47 |
| 8,248,009 | B2* | 8/2012 | Campbell | H02P 31/00 318/111 |
| 8,649,159 | B2* | 2/2014 | Fujita | H01L 25/072 310/43 |
| 2004/0228094 | A1* | 11/2004 | Ahmed | H01L 25/072 361/702 |
| 2005/0270745 | A1* | 12/2005 | Chen | H01F 27/2804 361/707 |
| 2008/0068806 | A1* | 3/2008 | Han | H05K 7/20963 361/714 |
| 2009/0268405 | A1* | 10/2009 | Kaveh | H05K 7/20918 361/697 |
| 2010/0025126 | A1* | 2/2010 | Nakatsu | B60L 11/00 180/65.1 |
| 2011/0188280 | A1* | 8/2011 | Nagano | H05K 7/20918 363/141 |
| 2012/0008286 | A1* | 1/2012 | Suzuki | B60L 11/14 361/730 |
| 2012/0162912 | A1* | 6/2012 | Kim | H05K 7/20909 361/692 |
| 2013/0077244 | A1* | 3/2013 | Bajan | H05K 7/20927 361/699 |
| 2013/0088128 | A1* | 4/2013 | Nakano | B62D 5/0406 310/68 R |
| 2013/0215573 | A1* | 8/2013 | Wagner | H05K 7/20927 361/702 |
| 2013/0294040 | A1 | 11/2013 | Fukumasu et al. | |
| 2014/0311716 | A1* | 10/2014 | Yamada | H02K 11/0073 165/121 |
| 2014/0321065 | A1* | 10/2014 | Nishimura | H05K 1/0203 361/722 |
| 2015/0029666 | A1* | 1/2015 | Kosuga | H02M 3/28 361/699 |
| 2015/0163961 | A1* | 6/2015 | Hara | H02M 7/003 361/699 |
| 2015/0274197 | A1* | 10/2015 | Saito | B62D 5/0406 318/400.29 |
| 2015/0280650 | A1* | 10/2015 | Brown | H03F 1/0205 361/721 |
| 2015/0282291 | A1* | 10/2015 | Singh | H05K 1/021 361/689 |
| 2016/0088771 | A1* | 3/2016 | Schoerner | H05K 7/1432 361/714 |
| 2016/0120069 | A1* | 4/2016 | Raassina | H05K 7/20509 361/697 |
| 2016/0128236 | A1* | 5/2016 | Pietrantonio | H05K 7/209 361/702 |
| 2016/0165762 | A1* | 6/2016 | Borisov | H02M 5/40 361/700 |

FOREIGN PATENT DOCUMENTS

| | | |
|---|---|---|
| JP | 5601912 B2 | 10/2014 |
| JP | 2014236562 A | 12/2014 |
| KR | 10-2005-0035313 A | 4/2005 |
| KR | 1020150025347 A | 3/2015 |
| KR | 10-2016-0011867 A | 2/2016 |

OTHER PUBLICATIONS

Office Action dated Jul. 1, 2017 issued in corresponding Korean Application No. 10-2016-0021748.

* cited by examiner

FIG. 1

PRIOR ART

FIG. 2

PRIOR ART

INVERTER

BACKGROUND

1. Technical Field

The present application claims priority to Korean Patent Application No. 10-2016-0021748 filed on Feb. 24, 2016 in the Republic of Korea, the disclosures of which are incorporated herein by reference.

The present disclosure relates to an inverter, and more particularly, to an inverter capable of attenuating noise during operation by structurally separating a signal unit from a power unit.

2. Description of the Related Art

Typically, a motor drive device is supplied with power from a commercial power source. Then, the motor driving device varies the voltage and frequency of the power and supplies the varied power to the motor, thereby controlling the speed of the motor with high efficiency. A conventional motor configured as above is described below.

Figure 1:
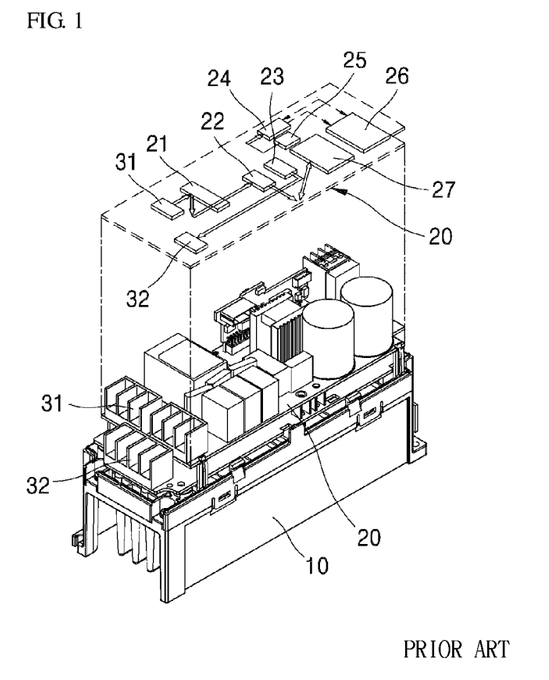
FIG. 1 illustrates a conventional inverter and power and signal flows thereof.
Figure 2:
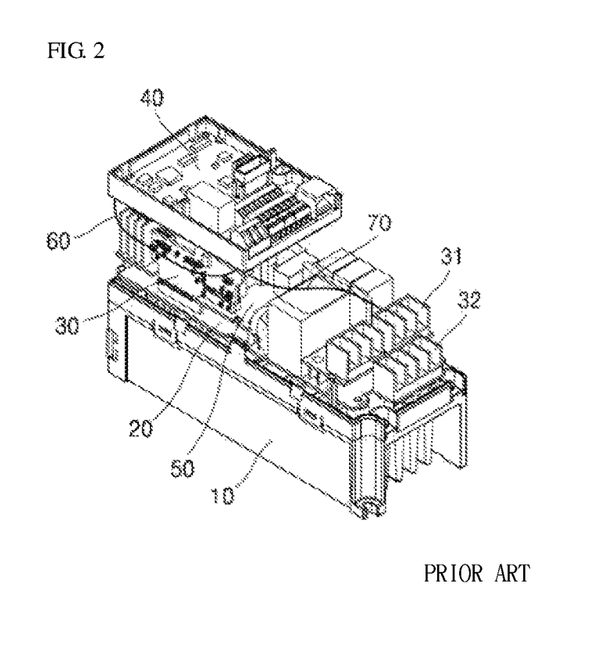
FIG. 2 illustrates the structure of the conventional inverter.

FIG. 1 illustrates a conventional inverter and power and signal flows thereof, and FIG. 2 is a perspective view illustrating the conventional motor drive seen from another side.

Referring to FIGS. 1 and 2, the conventional inverter includes a heat sink 10 and a plurality of circuit boards 20, 30, 40, 50, which are installed on a base.

The heat sink 10 is installed on the base.

The circuit boards 20, 30, 40, 50 are disposed on a middle base, which is disposed on the heat sink 10.

The circuit boards 20, 30, 40, 50 include a power board 20 disposed on the middle base, a cap board 50 disposed on the power board 20, a control board 30 perpendicularly connected to the power board 20, and an I/O board 40 disposed on control board 30.

In FIG. 1, the hollow arrow indicates flow of a main power along an input terminal 31, a rectification part 22, a DC link 27, an inverter part 23, and an output terminal 32.

The solid arrow indicates an SMPS secondary power source 25, which supplies power to the control board 30, a gate drive, and a sensing and protection circuit 26.

The dotted arrow indicates signals of a controller 24 of the control board 30, the gate drive and the sensing and protection circuit 26.

In the case of power flow and signal flow of the conventional inverter described above, interference occurs between the output of the rectification part 22 and the output of inverter part 23 due to intersection of main power therebetween.

That is, for the conventional inverter, a power terminal, a power unit such as PIM, and a signal unit are installed on the same board.

Accordingly, the signal of the conventional inverter is structurally subjected to interference by the flow of main power as described above.

Referring to FIG. 2, the conventional I/O board 40 and the control board 30 are electrically connected to each other through a wire 60 for signals, thereby forming a signal line.

The I/O board 40 is connected to the power board 20 through a ground wire 70 formed on the corresponding board, and the ground wire 70 connected to the power board 20 is extended and connected to the heat sink 10.

According to the configuration described above, the conventional inverter is structurally weak as it uses wires such as a signal wire capable of functioning as a noise antenna and a ground wire.

In addition, in the conventional cases, as the wires are used, fire may be caused by contact between the wires and a component generating heat in the process of assembling a product. Thereby, damage to the product and malfunctioning may occur.

Prior art documents related to the present disclosure include Korean Patent Application Publication No. 10-2007-0053940 (Publication Date: May 28, 2007). This document discloses a flexible print circuit board preventing circuit interference among the layers.

SUMMARY

It is an object of the present disclosure to provide an inverter capable of attenuating noise during operation by structurally separating a signal unit from a power unit.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an inverter is provided.

The inverter includes a base provided with a heat dissipation part, a main board disposed on the base to output an input power along an independent power flow through a rectification part and a inverter part, and a control board fixed to be electrically connected to the main board to form a flow of a secondary power and a flow of an electrical signal, the flow of the secondary power and the flow of the electrical signal being independent from each other.

Preferably, the main board includes an input power connection part to receive the input power, the rectification part, a DC link, an inverter part, and an output terminal.

Preferably, the independent power flow is formed through the input power connection part, the rectification part, the DC link, the inverter part, and the output terminal.

Preferably, the main board further includes an SMPS power connection part.

Preferably, the control board includes an SMPS power input unit electrically connected to the SMPS power connection part to input the secondary power, a controller, an SMPS power unit, and a signal unit.

Preferably, the SMPS power unit generates the secondary power and forms the flow of the second power transmitted to the controller and the signal unit.

Preferably, a signal flow is formed between the controller and the signal unit.

Preferably, the main board is grounded by contacting a metal rod connected to the heat dissipation part, the metal rod penetrating the main board.

Preferably, the control board is provided with a ground connection part.

Preferably, a ground screw is installed at the ground connection part, the ground screw contacting the heat dissipation part.

Preferably, the control board is electrically connected to an I/O board disposed on the main board, the control board fixing the I/O board.

Preferably, the I/O board is provided with a pattern connected to the ground connection part.

According to an embodiment of the present disclosure, a signal unit and a power unit are structurally separated from each other. Thereby, noise may be efficiently attenuated during operation.

Further, multiple boards combined to be electrically connected to each other are grounded to a heat dissipation part serving as a heat sink, using a ground screw and a metal rod rather than using a wire. Thereby, the problems resulting from use of wires in the prior art may be addressed.

DETAILED DESCRIPTION

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Figure 3:
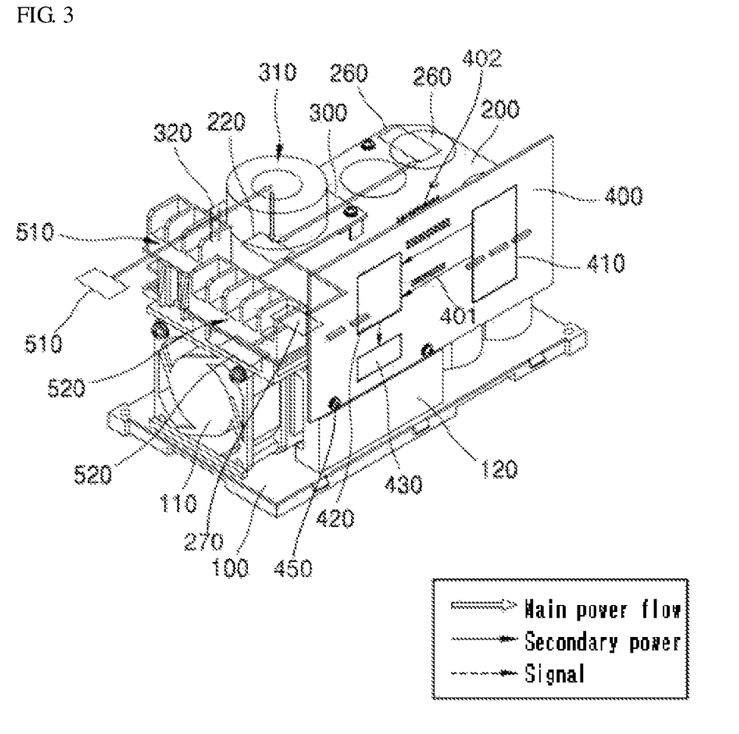
FIG. 3 is a perspective view illustrating an inverter and power and signal flows according to an embodiment of the present disclosure.
Figure 4:
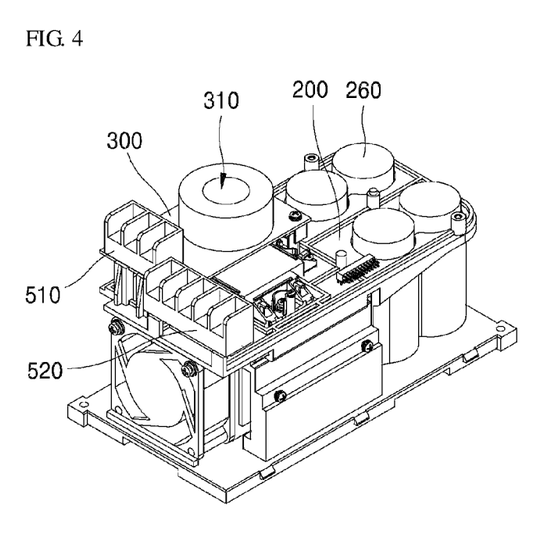
FIG. 4 is a perspective view illustrating arrangement of a main board according to an embodiment of the present disclosure.
Figure 5:
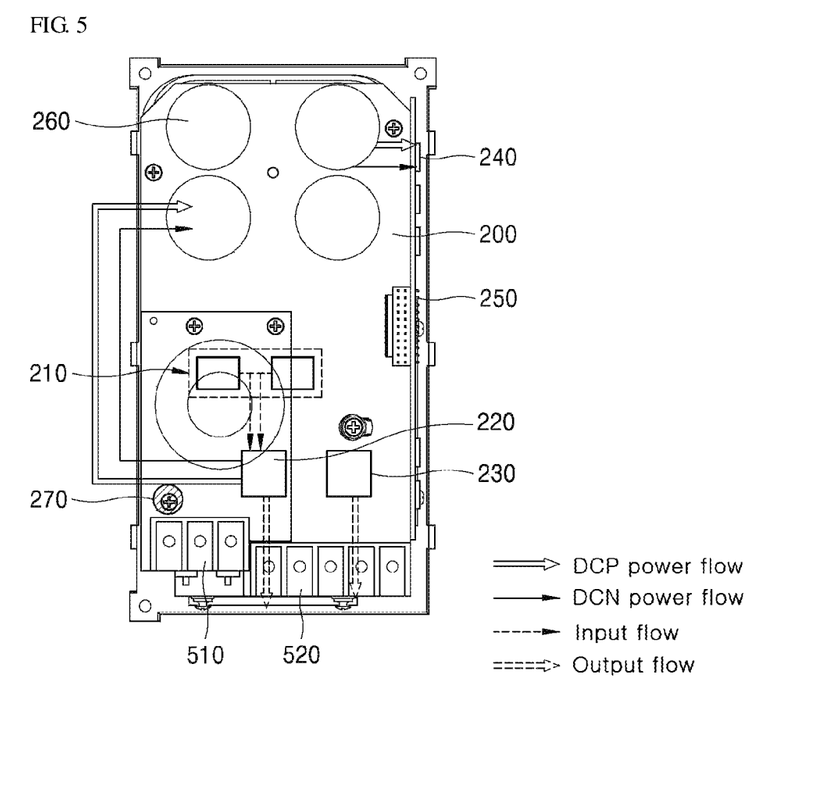
FIG. 5 illustrates power flow according to an embodiment of the present disclosure.

FIG. 3 is a perspective view illustrating an inverter and power and signal flows according to an embodiment of the present disclosure, FIG. 4 is a perspective view illustrating arrangement of a main board according to an embodiment of the present disclosure, and FIG. 5 illustrates power flow according to an embodiment of the present disclosure.

Hereinafter, the structure of an inverter according to an embodiment of the present disclosure will be described with reference to FIG. 3.

Referring to FIG. 3, the butter according to an embodiment includes a base 100, a heat dissipation part 120, a main board 200, an EMC board 300, and a control board 400. An I/O board is not shown.

The heat dissipation part 120 is installed on the base 100. The area of the heat dissipation part 120 is smaller than the area of the base 100.

A side portion of the heat dissipation part 120 is provided with a heat dissipation fan 110, which is exposed to the outside.

The main board 200 is disposed at the upper end of the heat dissipation part 120.

Herein, the area of the main board 200 may be larger than the area for installation of the heat dissipation part 120.

A plurality of DC links 260 is fitted into the main board 200.

The plurality of DC links 260 may protrude downward from the main board 200 and be disposed at the side portion of the heat dissipation part 120.

Accordingly, the DC links 260 may not protrude upward from the main board 200.

In addition, the EMC board 300 is installed at an upper portion of the main board 200, and an EMC filter 310 is mounted on the EMC board 300.

An input terminal 510 is disposed at one side of the main board 200 and an output terminal 520 is positioned adjacent to the input terminal 510.

The main board 200 includes an input power connection part 210 (see FIG. 5), a rectification part 220, the DC links 260, the inverter part 270, and the output terminal 520.

In this embodiment, the control board 400 is perpendicularly installed so as to be electrically connected and fixed to the side portion of the main board 200.

Herein, the lower end portion of the control board 400 is preferably disposed so as to be exposed to a side portion of the heat dissipation part 120. That is, the lower end portion of the control board 400 may be exposed to the side portion of the heat dissipation part 120, thereby readily dissipating heat.

Herein, the control board 400 includes a SMPS power input unit 411 (see FIG. 8), a controller 420, an SMPS power unit 410, and a signal unit 430.

The SMPS power input unit 411 is electrically connected to an SMPS power connection part formed on the main board 200. The SMPS power connection part will be described later.

Meanwhile, the main board 200 is grounded to a metal rod 320 connected to the heat dissipation part 120 as the metal rod 320 contacts the main board 200 in a penetrating manner. The heat dissipation part 120 is formed of aluminum.

In addition, the control board 400 is provided with a ground connection part 451.

A ground screw 450 contacting the heat dissipation part 120 is installed on the ground connection part 451.

Additionally, although not shown in the figure, the control board 400 may fix an I/O board disposed on the main board 200 by being electrically connected to the I/O board.

The I/O board is provided with a pattern connected to the ground connection part 451.

Next, a description will be given of a signal flow system according to independent formation of power flow and signal flow through the inverter of the present disclosure configured as above.

Hereinafter, power flow of the inverter according to an embodiment will be described with reference to FIG. 3.

In FIG. 3, the hollow arrow indicates flow of a main power along the input terminal 510, the rectification part 220, the DC links 260, the inverter part 270, and the output terminal 520.

In addition, the solid arrow indicates flow of a secondary power of SMP supplied from the SMPS power unit 410 to the controller 420 and the sensing and protection circuit unit 430.

In addition, a signal flow is formed between the controller 420 and the sensing and protection circuit unit 430.

As described above, according to an embodiment of the present disclosure, intersection of main power flows does not occur.

That is, in this embodiment, in implementing power flow and signal flow, the boards 200, 300, 400 are structurally separated from each other. Thereby, interference between signal flows may be prevented.

Referring to FIGS. 4 and 5, an input AC power is applied to the rectification part 220 via the input power connection part 210 connected to the input terminal 510.

Subsequently, the DC power obtained through the rectification part 220 is transmitted to the DC links 260, and the DC links 260 make the DC power smooth.

After passing through the DC links 260, the DC power is applied to the inverter part 270.

Herein, a connector 401 is installed at a side portion of the main board 200.

The connector 401 is electrically connected to the control board 400 to transfer a signal.

Herein, a PWM signal from the control board 400 is transmitted to the inverter part 270 through the connector 401.

In addition, the inverter part 270 may output an AC power to the outside via the output terminal 520.

In addition, an SMPS power connection part 240 is installed on the main board 200.

Figure 6:
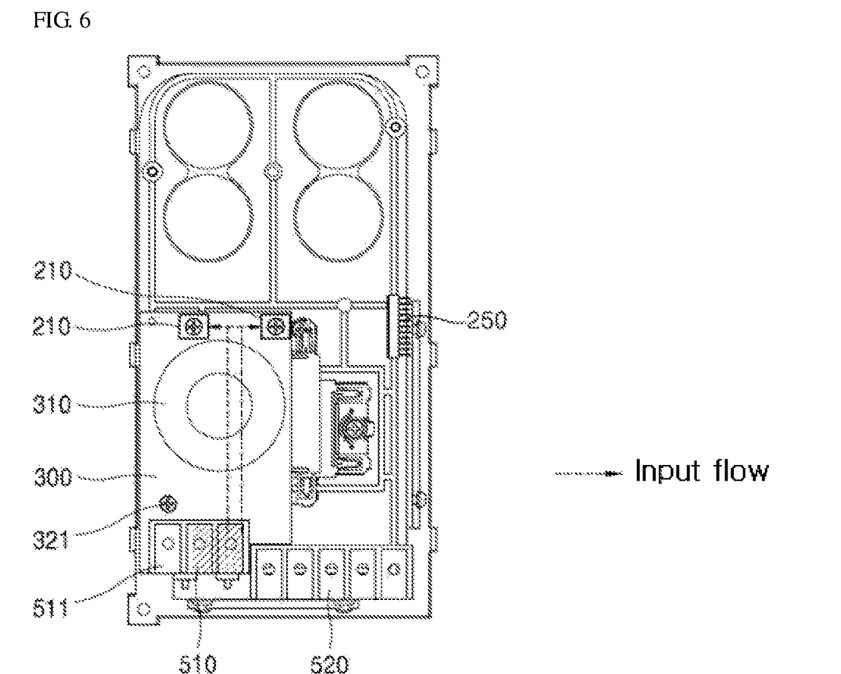
FIG. 6 illustrates power flow on an EMC board according to an embodiment of the present disclosure.

FIG. 6 illustrates power flow on an EMC board according to an embodiment of the present disclosure.

Referring to FIG. 6, the EMC board 300 is disposed on the main board 200.

A ground screw 321 is installed on the EMC board 300.

The ground screw 321 is fastened to the metal rod 320, which protrudes upward through the main board 200 described above.

Herein, an EMC filter 310 and an input power connection part 210 are installed on the EMC board 300.

The EMC filter 310 is not electrically connected to either the input power connection part 210 or the output terminal 520.

Power flow on EMC board 300 is formed as follows.

An AC power input from the input terminal 510 may be transmitted to the main board 200 via the EMC filter 310 and the input power connection part 210.

The reference numeral "511" indicates a ground terminal block.

Figure 7:
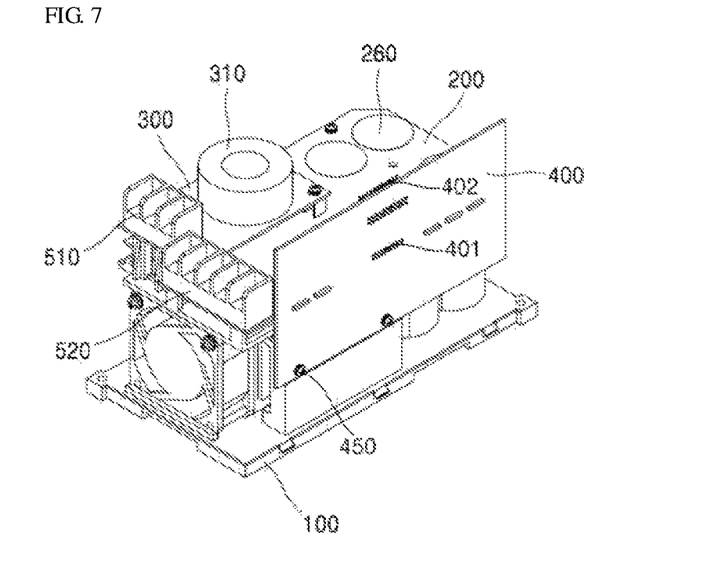
FIG. 7 is a perspective view illustrating installation of a control board according to an embodiment of the present disclosure.

FIG. 7 is a perspective view illustrating installation of a control board according to an embodiment of the present disclosure.

Figure 8:
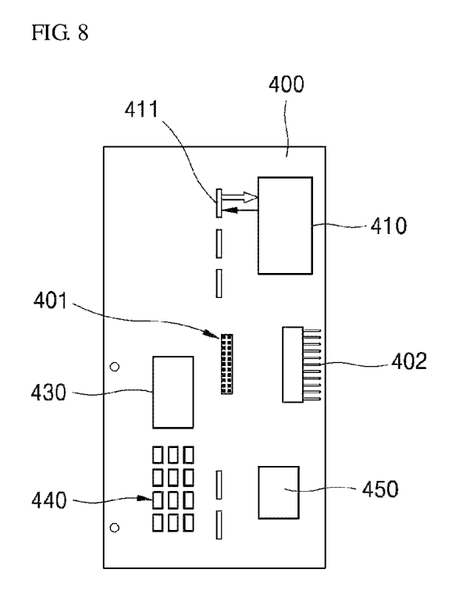
FIG. 8 illustrates flow of a secondary power and a signal on a control board.

Referring to FIGS. 7 and 8, the main board 200 of this embodiment includes an SMPS power connection part 250.

In addition, the control board 400 includes an SMPS power input unit 411 electrically connected to the SMPS power connection part 250 to input a secondary power, a controller, an SMPS power unit 410, and a signal unit 430.

In addition, a sensing and protection circuit unit 430 and a gate drive 470 are installed on the control board 400.

The SMPS power unit 410 generates the secondary power. Thereby, the SMPS power unit 410 forms flow of the second power transmitted to the controller 420 and signal unit 430 and forms a signal flow between the controller 420 and signal unit 430.

When the power is input from the SMPS power connection part 250 to the SMPS power input unit 411, a secondary power used for control, sensing and protection is generated by the SMPS power unit 410.

The generated a secondary power is supplied to a DSP 460, the sensing and protection circuit unit 430, and the gate drive 440 to drive the inverter part 270.

Thereby, the control board 400 to drive the inverter part 270 may be structurally separated from the main board 200 serving as a power unit forming power flow.

According to the configuration and operation described above, in this embodiment, the signal unit is structurally separated from the power unit. Thereby, noise may be efficiently attenuated during operation.

The main board 200 may be grounded as the metal rod 320 connected to the heat dissipation part 120 contacts the main board 200 in the penetrating manner.

In addition, a ground connection part (not shown) may be formed on the control board 400.

Additionally, a ground screw 450 contacting the heat dissipation part 120 is installed on the ground connection part.

Further, another connector 402 may be formed on the control board 400 and be electrically connected to the I/O board disposed on the main board 200, thereby fixing the I/O board.

The I/O board may be provided with an inverter connected to the ground connection part.

According to the configuration and operation described above, the present disclosure may be grounded to the heat dissipation part using a metal rod, a ground screw, and a circuit pattern rather than using a wire. Thereby, the problems of the conventional technology such as damage to a product, malfunctioning and fire, which may occur in the event that the wire contacts a heat dissipating component in the product in the process of assembling the product, may be efficiently addressed.

Although embodiments of an inverter having a noise attenuation structure have been described above, it is apparent to those skilled in the art that various changes may be made to the present disclosure without departing from the scope of the present disclosure.

Therefore, the scope of the present disclosure should not be limited to the embodiments described above, and should be defined by the claims accompanying claims and equivalents thereof.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:
1. An inverter comprising:
a base provided with a heat dissipation part;
a main board disposed on the base to output an input power along an independent power flow through a rectification part and a inverter part; and
a control board fixed to be electrically connected to the main board to form a flow of a secondary power and a flow of an electrical signal, the flow of the secondary power and the flow of the electrical signal being independent from each other,
wherein the main board comprises an input power connection part to receive the input power, the rectification part, a DC link, an inverter part, and an output terminal, and
wherein an area of the main board is wider than an area for installation of the heat dissipation part,
wherein the independent power flow is formed through the input power connection part, the rectification part, the DC link, the inverter part, and the output terminal, and
wherein the main board further comprises an SMPS power connection part,
wherein the control board is fixed to a side portion of the main board, the control board comprising:

an SMPS power input unit electrically connected to the SMPS power connection part to input the secondary power, a controller, an SMPS power unit, and a signal unit, wherein the SMPS power unit generates the secondary power and forms the flow of the second power transmitted to the controller and the signal unit, wherein a signal flow is formed between the controller and the signal unit.

2. The inverter according to claim 1, wherein the main board is grounded by contacting a metal rod connected to the heat dissipation part, the metal rod penetrating the main board.

3. The inverter according to claim 2, wherein the control board is provided with a ground connection part, wherein a ground screw is installed at the ground connection part, the ground screw contacting the heat dissipation part.

4. The inverter according to claim 3, wherein the control board is electrically connected to an I/O board disposed on the main board, the control board fixing the I/O board, wherein the I/O board is provided with a pattern connected to the ground connection part.

* * * * *